US012790717B2

(12) United States Patent
Zeman et al.

(10) Patent No.: US 12,790,717 B2
(45) Date of Patent: Nov. 10, 2026

(54) DEVICE AND METHOD FOR PRODUCING A MONOCRYSTALLINE SILICON ROD

(71) Applicant: SILTRONIC AG, Munich (DE)

(72) Inventors: Otto Zeman, Ampfing (DE); Quoc Thai Do, Burghausen (DE); Patrick Eschenbacher-Bladt, Burghausen (DE); Georg Raming, Tann (DE)

(73) Assignee: SILTRONIC AG, Munich (DE)

( * ) Notice: Subject to any disclaimer, the term of this patent is extended or adjusted under 35 U.S.C. 154(b) by 286 days.

(21) Appl. No.: 18/294,193

(22) PCT Filed: Jul. 22, 2022

(86) PCT No.: PCT/EP2022/070576

§ 371 (c)(1),
(2) Date: Feb. 1, 2024

(87) PCT Pub. No.: WO2023/011939

PCT Pub. Date: Feb. 9, 2023

(65) Prior Publication Data

US 2025/0092563 A1 Mar. 20, 2025

(30) Foreign Application Priority Data

Aug. 2, 2021 (EP) .................................... 21189238

(51) Int. Cl.
*C30B 15/32* (2006.01)
*C30B 29/06* (2006.01)

(52) U.S. Cl.
CPC .............. *C30B 15/32* (2013.01); *C30B 29/06* (2013.01)

(58) Field of Classification Search
CPC .......... C30B 15/16; C30B 15/32; C30B 29/06
See application file for complete search history.

(56) References Cited

U.S. PATENT DOCUMENTS 6,338,757 B1 * 1/2002 Nishimoto .............. C30B 15/14 117/200
2008/0110394 A1 * 5/2008 Noda ...................... C30B 15/00 117/88

(Continued)

FOREIGN PATENT DOCUMENTS

CN 112647124 A * 4/2021 ............. C30B 15/00
JP H05219 A 1/1993

(Continued)

OTHER PUBLICATIONS

English computer translation of CN-112647124-A (Year: 2025).*
English computer translation of JP-2006131440-A (Year: 2025).*

*Primary Examiner* — Matthew J Song
(74) *Attorney, Agent, or Firm* — LEYDIG, VOIT & MAYER, LTD.

(57) ABSTRACT

A single crystal of silicon may be pulsed by a method that includes installing a seed holder on a drawing shaft in a Czochralski crystal pulling apparatus. Here, a dish, in a form of a hollow truncated cone, is secured between the seed holder and the drawing shaft such that an opening of the dish faces the drawing shaft. The dish has a top radius, a height, a material thickness, a base plate having a base plate radius, and a bore having a diameter. The method further includes: mounting a crystal seed into the seed holder; melting polycrystalline silicon in a crucible to create a melt; lowering the drawing shaft until the crystal seed is in contact with the melt; and pulling the single crystal. The drawing shaft and the dish are wetted with oil, prior to pulling the single crystal.

6 Claims, 2 Drawing Sheets

(56) References Cited

U.S. PATENT DOCUMENTS

| | | | |
|---|---|---|---|
| 2012/0024761 A1 | 2/2012 | Grabbe et al. |
| 2015/0068444 A1 | 3/2015 | Masaki et al. |
| 2019/0388943 A1 | 12/2019 | Okita |
| 2021/0340690 A1 | 11/2021 | Molchanov |

FOREIGN PATENT DOCUMENTS

| | | | | |
|---|---|---|---|---|
| JP | H05221786 A | | 8/1993 | |
| JP | 2006131440 A | * | 5/2006 | ............. C30B 15/32 |
| WO | WO 2018142541 A1 | | 8/2018 | |
| WO | WO 2020074285 A1 | | 4/2020 | |

* cited by examiner

DEVICE AND METHOD FOR PRODUCING A MONOCRYSTALLINE SILICON ROD

CROSS REFERENCE TO RELATED APPLICATIONS

This application is a U.S. National Phase application under 35 U.S.C. § 371 of International Application No. PCT/EP2022/070576, filed on Jul. 22, 2022, and claims benefit to European Patent Application No. EP 21189238.5, filed on Aug. 2, 2021. The International Application was published in English on Feb. 9, 2023 as WO 2023/011939 A1 under PCT Article 21(2).

FIELD

The present disclosure is directed to a device that allows the production of monocrystalline silicon rods by the Czochralski process with higher dislocation free yields.

BACKGROUND

Single crystal silicon, which is the starting material for most semiconductor electronic device fabrication processes, is usually produced by the so-called Czochralski ("CZ") process. In this process, polycrystalline silicon ("polysilicon") is placed in a crucible and melted, a seed crystal is brought into contact with the molten silicon, and a single crystal is grown by slow extraction.

Particles generated during crystal growth and entering the melt can cause the grown crystal to become dislocated, resulting in a loss of the desired quality of the crystal. This in turn leads to a significant loss of yield and thus to increased costs.

It must therefore be avoided that particles from the crystal growth system come in contact with the melt or the crystal-melt interface.

In patent application WO 2020 074 285 A1, a special heat shield is proposed to prevent particles from the gas phase from falling onto the melt causing the growing crystal to generate defects.

SUMMARY

In an embodiment, the present disclosure provides a method for pulling a single crystal of silicon that includes installing a seed holder on a drawing shaft in a Czochralski crystal pulling apparatus. Here, a dish, in a form of a hollow truncated cone, is secured between the seed holder and the drawing shaft such that an opening of the dish faces the drawing shaft. The dish has a top radius, a height, a material thickness, a base plate having a base plate radius, and a bore having a diameter. The method further includes: mounting a crystal seed into the seed holder; melting polycrystalline silicon in a crucible to create a melt; lowering the drawing shaft until the crystal seed is in contact with the melt; and pulling the single crystal. The drawing shaft and the dish are wetted with oil, prior to pulling the single crystal.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
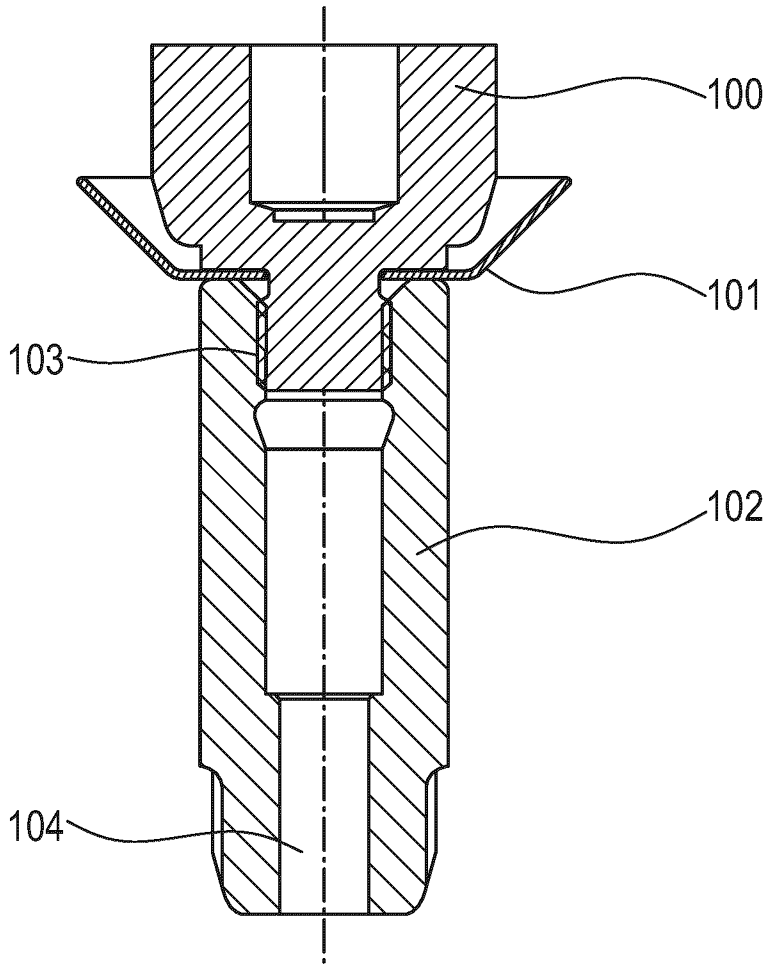
FIG. 1 depicts a preferred embodiment of the present disclosure.

The present inventors have discovered that using a special heat shield to prevent particles from the gas phase from falling onto the melt helps, but is far from sufficient to achieve desired yields.

Therefore, aspects of the present disclosure provide a device that makes it possible to produce a monocrystalline rod without experiencing the described negative effects of dust and particles in the drawing equipment.

FIG. 1 depicts a preferred embodiment of the present disclosure. In FIG. 1, a seed holder (102) is mounted on the lower part of the drawing shaft (100) by a thread (103), and a dish (101) is clamped between the seed holder and drawing shaft. When in operation, the crystal seed can be clamped into the seed holder by holding means (also called a holder herein) (104).

Figure 2:
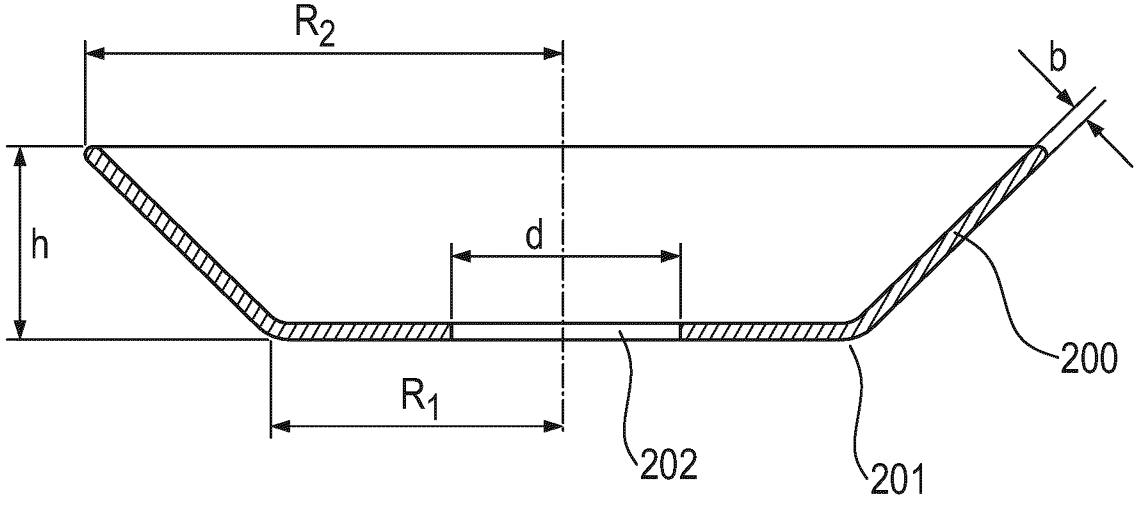
FIG. 2 shows a preferred embodiment of a dish used in FIG. 1.

FIG. 2 shows a preferred embodiment of the dish (200) used in FIG. 1. The dish is preferably made of carbon fiber reinforced carbon (CFC) having a material thickness b of more than 1 mm and less than 5 mm.

The shape of the dish preferably has the form of a hollow truncated cone having a height h and having a base plate (201) with a base radius R1 and a top radius R2. The base plate comprises a bore (202) having a bore diameter d.

During the CZ pulling process, particles (dopants such as P, Sb, As, SiO, SiO2, Si, etc.) are deposited on the water-cooled drawing shaft of the Czochralski system. These particles can detach, fall towards the melt, and cause dislocations in the crystal.

Aspects of the present disclosure further provide a device for pulling a crystal according to Czochralski, which makes it possible to minimize the negative effects of particles on the integrity of the pulled crystal. In particular, it reduces the likelihood that a crystal will form dislocations during growth due to particles.

The preferred device comprises a drawing shaft, which is used during crystal growth to keep the crystal in upright position, rotate and pull up the crystal. The use of a drawing shaft is shown in WO 2020 074 285 A1 for example.

A modified drawing shaft is shown in WO 18 142 541 A1. The modified drawing shaft can also be utilized for implementing the present disclosure.

The preferred device may also include a seed holder that is suitable to hold the crystal seed during crystal pulling. An example of a suitable seed holder is for example shown in WO 2020 074 285 A1.

The preferred device may also include a dish in a form of a hollow truncated cone. A preferred embodiment of this device is shown in FIG. 2.

More preferably, the dish is made of carbon fiber reinforced carbon (CFC) having a material thickness b of more than 1 mm and less than 5 mm.

Preferably, the shape of the dish has the form of a hollow truncated cone having a height h and a base plate (201) with a base radius R1 and a top radius R2. The base plate comprises a bore (202) having a bore diameter d.

Most preferably, the height h is less than the difference of Radius R2 and Radius R1.

The bore of the baseplate of the dish is used to secure it between the drawing shaft and the seed holder. FIG. 1 exhibits a graphic representation of the preferred embodiment.

In a preferred embodiment the dish is secured between the seed holder and the drawing shaft using a thread as shown in FIG. 2.

The present inventors realized that the best effect is accomplished if the opening of the dish points towards the drawing shaft. Therefore, it is preferred to secure the opening of the dish facing towards the drawing shaft.

The present inventors have realized that, in order to prevent particles from falling into the melt, it is additionally very beneficial to wet the drawing shaft with oil. Preferably, a vacuum pump oil is used. It is believed that the coated surface of the drawing shaft offers a sticky surface for particles and therefore prevent them from falling down and enfold their malign behavior.

In performed experiments, the vacuum pump oil of type S2 R100 (by Shell) was used. However, this oil is not rated for high temperatures (above 100° C.) and the drawing shaft faces more than 600° C. crystals grown with this setup exhibit a lower dislocation rate. Nevertheless, the effect could be seen very clearly.

More preferably, it is very preferable to use said oil to completely wet the dish in addition.

In addition, the aspects of the present disclosure include a method for pulling a silicon crystal according to Czochralski. Preferably, the method comprises the following steps:

(a) installing a seed holder on a drawing shaft in a Czochralski crystal pulling apparatus, wherein a dish in a form of a hollow truncated cone is secured between the seed holder and the drawing shaft so that the opening of the dish faces the drawing shaft.

(b) Mounting a crystal seed into the seed holder.

(c) melting polycrystalline silicon in a crucible, (d) lowering the drawing shaft until the crystal seed gets in contact with the melt (e) and pulling the crystal.

More preferably the method comprises the wetting of the drawing shaft and the dish with oil. Most preferably, an oil is used that is suitable as vacuum pump oil.

The above description of exemplary embodiments is to be understood as exemplary. On the one hand, the disclosure thus made enables the person skilled in the art to understand the present invention and the advantages associated therewith, and on the other hand, in the understanding of the person skilled in the art, also includes obvious changes and modifications of the structures and methods described. Therefore, all such changes and modifications as well as equivalents shall be covered by the scope of protection of the claims.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

ABBREVIATIONS

100 drawing shaft
101 dish
102 seed holder
103 tread
104 holding means for seed crystal
200 dish
201 base plate
202 bore in the bas plate
R1 radius
R2 radius
h height
d diameter of the bore
b thickness of the material used.

The invention claimed is:

1. A method for pulling a single crystal, the method comprising:

installing a seed holder on a drawing shaft in a Czochralski crystal pulling apparatus, wherein a dish in a form of a hollow truncated cone is secured between the seed holder and the drawing shaft such that an opening of the dish faces the drawing shaft, and wherein the dish comprises a top radius, a height, a material thickness, a base plate having a base plate radius, and a bore having a diameter;

mounting a crystal seed into the seed holder;

melting polycrystalline silicon in a crucible to create a melt;

lowering the drawing shaft until the crystal seed is in contact with the melt; and pulling the single crystal, wherein the drawing shaft and the dish is wetted with oil.

2. The method according to claim 1, wherein the material thickness is not less than 1 mm and not greater than 5 mm.

3. The method according to claim 1, wherein the dish is made of carbon fiber reinforced carbon.

4. The method according to claim 1, wherein the height is less than the difference of the base plate radius and the top radius.

5. The method according to claim 1, wherein the oil is vacuum pump oil.

6. The method according to claim 1, the method further comprising completely wetting the dish.

* * * * *